(12) United States Patent
Kuan et al.

(10) Patent No.: US 11,557,552 B2
(45) Date of Patent: Jan. 17, 2023

(54) 3D TRENCH REFERENCE PLANES FOR INTEGRATED-CIRCUIT DIE PACKAGES

(71) Applicant: Intel Corporation, Santa Clara, CA (US)

(72) Inventors: Chin Lee Kuan, Bayan Lepas (MY); Jackson Chung Peng Kong, Tanjung Tokong (MY); Bok Eng Cheah, Bukit Gambir (MY)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 16/818,603

(22) Filed: Mar. 13, 2020

(65) Prior Publication Data

US 2020/0395318 A1  Dec. 17, 2020

(30) Foreign Application Priority Data

Jun. 12, 2019 (MY) .......................... PI 2019003326

(51) Int. Cl.
*H01L 23/66* (2006.01)
*H01L 23/498* (2006.01)

(52) U.S. Cl.
CPC ........ *H01L 23/66* (2013.01); *H01L 23/49822* (2013.01); *H01L 23/49838* (2013.01); *H01L 2223/6638* (2013.01)

(58) Field of Classification Search
CPC .. H01L 2223/6638; H01L 23/50; H01L 23/66
See application file for complete search history.

(56) References Cited

U.S. PATENT DOCUMENTS

2002/0060366 A1* 5/2002 Kikuchi ................. H01L 23/13
257/776

* cited by examiner

*Primary Examiner* — Tucker J Wright
(74) *Attorney, Agent, or Firm* — Schwegman Lundberg & Woessner, P.A.

(57) ABSTRACT

A voltage-reference plane has gradient regions that provide altered thicknesses that are useful in a power-deliver network for a semiconductor package substrate. Different signal trace types are located over various portions of the gradient regions to facilitate signal integrity.

17 Claims, 7 Drawing Sheets

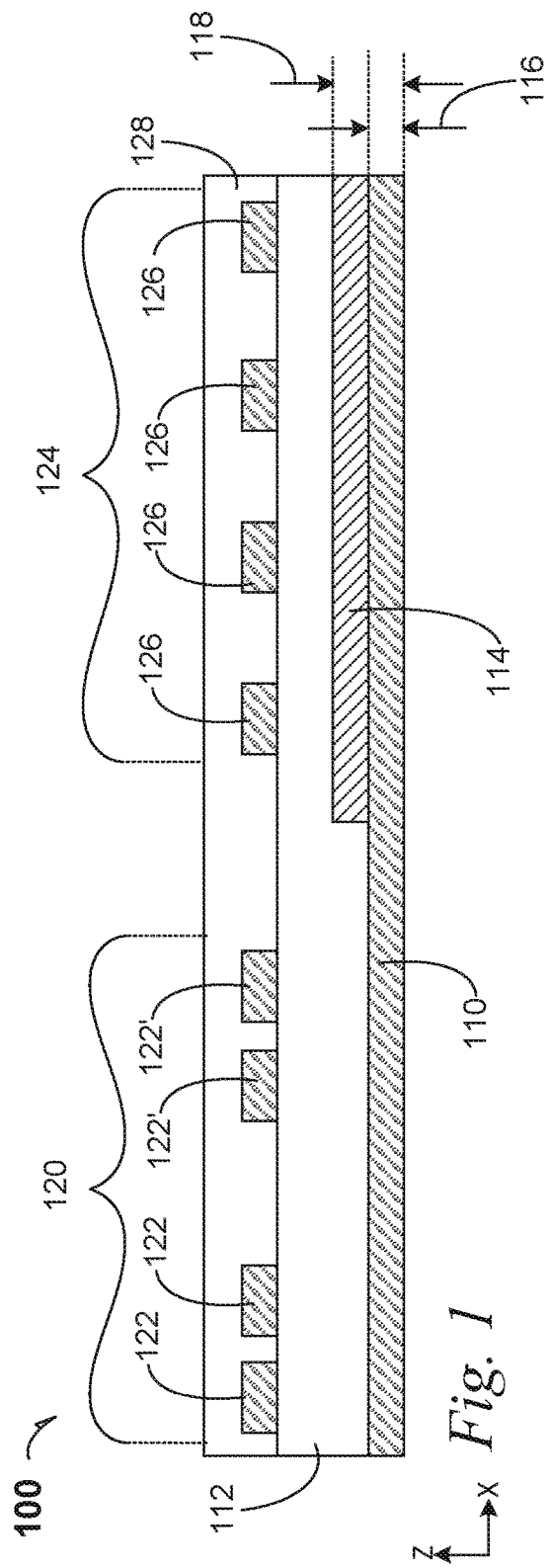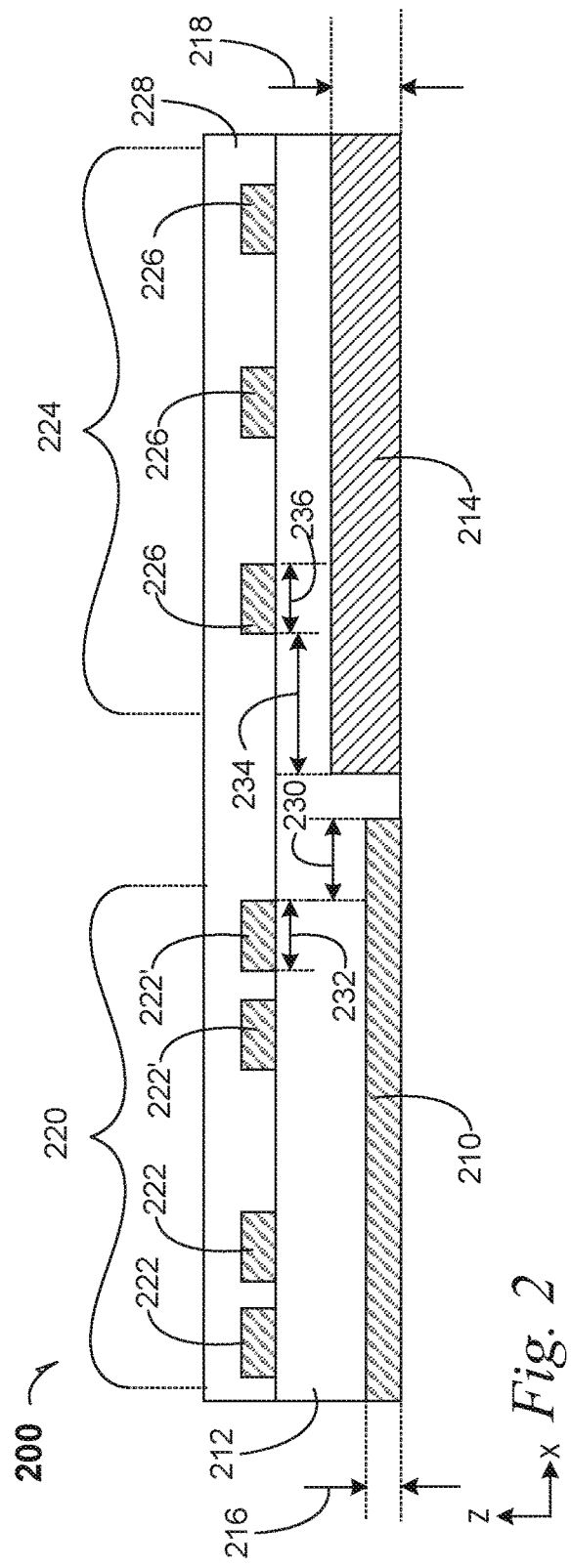

3D TRENCH REFERENCE PLANES FOR INTEGRATED-CIRCUIT DIE PACKAGES

PRIORITY APPLICATION

This application claims the benefit of priority to Malaysian Application Serial Number PI 2019003326, filed Jun. 12, 2019, which is incorporated herein by reference in its entirety.

FIELD

This disclosure relates to semiconductor packages that use different-thickness reference planes.

BACKGROUND

Semiconductive device miniaturization during packaging includes challenges to locate power, ground and signal traces within the package, while preserving and improving signal quality for integrated-circuit devices under increasing high-speed communication demands.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a cross-section elevation of an integrated-circuit package substrate according to an embodiment;

FIG. 2 is a cross-section elevation of an integrated-circuit package substrate according to an embodiment;

DETAILED DESCRIPTION

Figure 3:
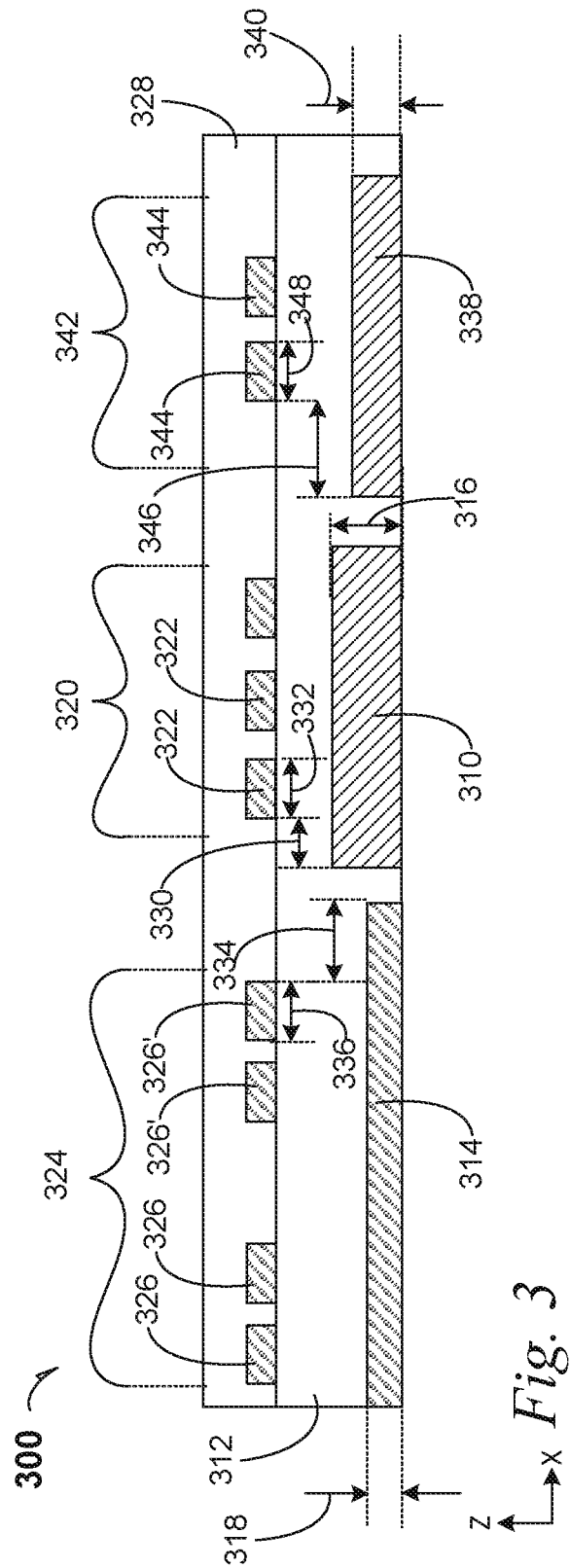
FIG. 3 is a cross-section elevation of an integrated-circuit package substrate according to an embodiment.

Power and signal integrity is addressed for thin and miniaturized semiconductor package apparatus, by locating different-thickness reference planes within the package substrates. The term "package substrate" used in this specification includes organic or ceramic-based package substrate, printed circuit board (PCB) substrate or silicon-based substrate. Different trace functions are located with respect to different-thickness reference planes, to obtain useful functionality of the traces. Where the different-thickness reference planes are located in a given semiconductor package substrate, they may be referred to as a three-dimensional (3D) reference plane. The 3D reference planes disclosed herein may be referred to a gradient-voltage planes. The gradient embodiments refer to each of stacked and in-contact voltage planes, as well as adjacent but isolated voltage planes that share at least a portion of the same Z-height location. Gradients refer to different Z-direction thicknesses, whether the voltage planes are stacked and in contact, or whether the voltage planes are adjacent but isolated within an integrated-circuit package substrate.

Single-sided platform embodiments employ ultra-thin stack-up architectures to minimize Z-height and to increase device battery capacity. Solutions are provided to address design stack-up tensions between high-speed differential signals and thinner dielectrics for crosstalk coupling resolution among high-density single-ended signals.

FIG. 1 is a cross-section elevation of an integrated-circuit package substrate 100 according to an embodiment. A first voltage-reference plane 110 is embedded in a composite organic mass 112, and other materials may be found below the first voltage-reference plane 110 including a land side of the package substrate 100. A second voltage-reference plane 114 contacts the first voltage-reference plane 110, and it has a different X-Y footprint from the first voltage-reference plane 110. The first and second voltage-reference planes 110, 114 are an integral structure. The second voltage-reference plane 114 includes at least a portion of the first voltage-reference plane 110. The second voltage-reference plane 114 includes a trench portion of the composite organic mass 112.

In an embodiment, the first voltage-reference plane 110 has a first Z-height 116, and the second voltage-reference plane 114 has a second Z-height 118 that includes at least a portion of the first Z-height 116. As illustrated, the interface between the first and second voltage-reference planes 110 and 114, occupy at least a portion of the same Z-height within the integrated-circuit package substrate 100. Fabrication and location of the second voltage plane 114 is achieved by locating the voltage plane 114 within a trench within organic structures of the integrated-circuit package substrate 100.

In an embodiment, the second Z-height 118 is greater than the first Z-height 116, which results in a thickness and consequent resistivity gradient where each of the planes 110 and 114 make contact. In an example embodiment, the first thickness 116 is about 28 micrometer ($\mu$m) and the second thickness 118 is about 66 $\mu$m. In an embodiment, the first Z-height is unity and the second Z-height is about 2.5 times unity. As depicted, the first and second voltage-reference planes 110 and 114 are referred to as a 3D voltage reference plane 110, 114 as they occupy at least a portion of the same Z-height within the integrated-circuit package substrate 100.

In an embodiment, a first signal region 120 of the integrated-circuit package substrate 100 includes differential-signal traces 122 that are superposed above a region (X-Y dimension) of the integrated-circuit package substrate 100 at the first voltage-reference plane 110 that is not also occupied by the second voltage-reference plane 114. In an embodiment, two of the traces 122 are a first differential-signal pair, and two of the traces 122' are a subsequent differential-signal pair 122'.

For example, the differential-signal pairs 122 and 122' are useful peripheral component interconnect express (PCIe) signal traces. In an embodiment, the differential-signal pairs 122 and 122' are useful for Universal Serial Bus (USB) type 3.0 signal traces. In an embodiment, the differential-signal pairs 122 and 122' are useful for SerDes Ethernet signal traces.

A second signal region 124, such as for single-ended signal traces 126 that are superposed above the second voltage-reference plane 114, such that a composite-thickness 118 acts as a current return path for the single-ended signal traces 126.

For example, the single-ended signal traces 126 are useful for a double-data-rate (DDR) memory signal traces 126. In an example embodiment, the single-ended signal traces 126 are useful for quad-date-rate (QDR) memory signal traces 126.

Consequently for the signal traces 1:26, reduced cross-talk is achieved through close proximity to the current return path (e.g., the second voltage-reference plane 114), while reduced conductor losses of the differential-signal traces 122 and 1:22' may be also achieved through increased distance from the current return path (e.g., the first voltage-reference plane 110). In an embodiment, an upper organic structure 128 is applied over the several traces 122 and 122', and 126 to complete a covering of the several traces. On or about the upper organic structure 128, a die side of the integrated-circuit package substrate 100 may be located.

In an embodiment, any of the above-described embodiments are employed with the planes 110 and 114 provided as a ground voltage-supply (Vss) structure associated to a ground voltage (Vss) source in a semiconductive or system device. In an embodiment, any of the above-described embodiments are employed with the planes 110 and 114 provided as a power voltage supply (Vcc) structure.

FIG. 2 is a cross-section elevation of an integrated-circuit package substrate 200 according to an embodiment. A first voltage-reference plane 210 is embedded in a composite organic mass 212, and other materials may be found below the first voltage-reference plane 210. A second voltage-reference plane 214 is seated adjacent but spaced apart from the first voltage-reference plane 210, and it has a completely different X-Y footprint from the first voltage-reference plane 210. By comparison to the Z-direction volume taken up by the first voltage-reference plane 210, the second voltage-reference plane 214 is at least partially located in a trench portion of the composite organic mass 212.

As illustrated, the bottom surfaces of the first and second voltage-reference planes 210 and 214, occupy at least a portion of the same Z-height within the integrated-circuit package substrate 200, up to and including the top of the first voltage-reference plane 210, where the reference arrow 216 meets the dashed line.

In an embodiment, the first voltage-reference plane 210 has a first Z-height 216, and the second voltage-reference plane 214 has a second Z-height 218 such that a height gradient exists between the two voltage planes. In an embodiment, the second Z-height 218 is greater than the first Z-height 216. As depicted, the first and second voltage-reference planes 210 and 214 are referred to as a 3D voltage reference plane 210, 214 as they occupy at least a portion of the same Z-height within the integrated-circuit package substrate 200.

In an embodiment, a first signal region 220 of the integrated-circuit package substrate 200 includes differential-signal traces 222 that are superposed above a region of the integrated-circuit package substrate 200 at the first voltage-reference plane 210. A second signal region 224, such as for single-ended signal traces 226 that are superposed above the second voltage-reference plane 214, such that the thickness 218 acts as a current return path for the single-ended signal traces 226. Consequently for the signal traces 226, reduced cross-talk is achieved through close proximity to the current return path (e.g., the second voltage-reference plane 214), while reduced conductor losses for the differential-signal traces 222 may be also achieved through increased distance from the current return path (e.g., the first voltage-reference plane 210).

In an embodiment, an upper organic structure 228 is applied over the several traces 222 and 226 to complete a covering of the several traces.

To preserve signal integrity for the traces 222, a trace-to-reference-plane spacing 230, defines spacing from an edge trace 222 with a trace width 232, and the edge of the first voltage-reference plane 210 that is spaced apart and adjacent the second voltage-reference plane 214. In an embodiment, spacing between two adjacent traces 222 is about one-half the width 232 of a given trace 222. In an embodiment, spacing 230 from a given trace 222' and the edge of the first voltage-reference plane 210 is in a range from about 1.0 times the width 232 to 4.0 times the width 232.

Similarly to preserve signal integrity for the traces 226, a trace-to-reference-plane spacing 234, defines spacing from an edge trace 226 with a trace width 236, and the edge of the second voltage-reference plane 214 that is spaced apart and adjacent the first voltage-reference plane 210. In an embodiment, spacing between two adjacent traces 226 is about one-half the width 236 of a given trace 226. In an embodiment, spacing 234 from a given trace 226 and the edge of the second voltage-reference plane 214 is in a range from about 2.0 times the width 236 to 5.0 times the width 236.

In an embodiment, the first and second voltage-reference planes 210, 214 are associated to a ground reference voltage (Vss). In an embodiment, the first and second voltage-reference planes 210, 214 are associated to different reference voltages such as the first voltage-reference plane 210 is associated to a ground reference voltage (Vss), meanwhile the second voltage-reference plane 214 is associated to a power reference voltage (Vcc). In an embodiment, the first voltage-reference plane 210 is associated to a Vcc at a first voltage, and the second voltage-reference plane 214 is associated to a Vcc at a second voltage. For example, where each plane is a Vcc plane, the first voltage-reference plane 210 is a Vcc plane for operation at 1.0V, and the second voltage-reference plane 214 is a Vcc plane for operation at 1.5V.

FIG. 3 is a cross-section elevation of an integrated-circuit package substrate 300 according to an embodiment. In an embodiment, it is useful to provide isolated voltage-reference planes within a given package substrate in order to have different supply voltages as well as different source-plane locations and qualities including Z-heights. For example, a voltage-reference plane may have three different thicknesses within the same semiconductor package substrate, for a useful geometry that addresses channel impedance, insertion loss and crosstalk coupling coefficient. The three isolated voltage-reference planes are located and selected with different thicknesses for opposite polarity. For example, a first voltage-reference plane is associated with power supply voltage (Vcc), and the second and third voltage-reference planes are associated with source or ground voltage (Vss). As depicted, the first, second and third voltage-reference planes 310, 314 and 338 are referred to as a 3D voltage reference plane 310, 314 and 338 as they occupy at least a portion of the same Z-height within the integrated-circuit package substrate 300.

A first voltage-reference plane 310 is embedded in a composite organic mass 312, and other materials may be found below the first voltage-reference plane 310. In an embodiment, the first voltage-reference plane 310 is a power supply (Vcc) plane 310, set below single-ended signal traces 322.

A second voltage-reference plane 314 is seated adjacent but spaced apart from the first voltage-reference plane 310, and it has a completely different X-Y footprint from the first voltage-reference plane 310. In an embodiment, the first voltage-reference plane 310 has a first Z-height 316, and the second voltage-reference plane 314 has a second Z-height 318. In an embodiment, the first Z-height 316 is greater than the second Z-height 318.

In an embodiment, two of the traces 326 are a first differential-signal pair, and two of the traces 326' are a subsequent differential-signal pair 326'.

For example, the differential-signal pairs 326 and 326' are useful for peripheral component interconnect express (PCIe) signal traces. In an embodiment, the differential-signal pairs 326 and 326' are useful for Universal Serial Bus (USB) type 3.0 signal traces. In an embodiment, the differential-signal pairs 326 and 326' are useful for SerDes Ethernet signal traces.

In an embodiment, a third voltage-reference plane 338 is seated adjacent but spaced apart from the first voltage-reference plane 310, and it has a completely different X-Y footprint from the first voltage-reference plane 310. The third voltage-reference plane 338 has a third Z-height 340. As illustrated, the bottom surfaces of the first, second and third voltage-reference planes 310, 314 and 338, respectively, occupy at least a portion of the same Z-height within the integrated-circuit package substrate 300, up to and including the top of the second voltage-reference plane 314, where the reference arrow 318 meets the dashed line. In an embodiment, the third Z-height 338 is greater than the second Z-height 318, but lesser than the first Z-height 316.

By comparison to the Z-direction volumes taken up by the second and third voltage-reference planes 314 and 338, the first voltage-reference plane 310 is at least partially located in a trench portion of the composite organic mass 312.

In an embodiment, a first signal region 320 of the integrated-circuit package substrate 300 includes single-ended traces 322 that are superposed above a region of the integrated-circuit package substrate 300 at the first voltage-reference plane 310. A second signal region 324, such as for differential signal traces 326 that are superposed above the second voltage-reference plane 314, such that the thickness 318 acts as a current return path for the differential signal traces 326. Consequently for the differential signal traces 326, reduced conductor losses is achieved through increased distance from the current return path (e.g., the second voltage-reference plane 314), while reduced cross-talk for the single-ended traces 322 may be also achieved through close proximity to the current return path (e.g., the first voltage-reference plane 310).

A third signal region 342, such as for a differential-signal pair 344 is useful for peripheral component interconnect express (PCIe) signal traces. In an embodiment, the differential-signal pair 344 is useful for Universal Serial Bus (USB) type 3.0 signal traces. In an embodiment, the differential-signal pair 344 is useful for SerDes Ethernet signal traces.

The differential-signal pair 344 is superposed above the third voltage-reference plane 338, such that the thickness 340 acts as a current return path for the differential signal traces 344 and achieves a channel impedance that is different (e.g., lower) compared to the differential signal traces 326 under the conditions where the trace geometries (e.g., trace width and trace spacing) are identical. Consequently for the differential signal traces 344, reduced conductor losses is achieved through increased distance from the current return path (e.g., the third voltage-reference plane 338), while reduced cross-talk for the single-ended traces 322 may be also achieved through close proximity to the current return path (e.g., the first voltage-reference plane 310).

In an embodiment, an upper organic structure 328 is applied over the several traces 322, 326 and 344 to complete a covering of the several traces.

To preserve signal integrity for the traces 322, a trace-to-reference-plane spacing 330, defines spacing from an edge trace 322 with a trace width 332, and the edge of the first voltage-reference plane 310 that is spaced apart and adjacent the second voltage-reference plane 314. Similarly to preserve signal integrity for the traces 326, a trace-to-reference-plane spacing 334, defines spacing from an edge trace 326 with a trace width 336, and the edge of the second voltage-reference plane 314 that is spaced apart and adjacent the first voltage-reference plane 310.

Similarly to preserve signal integrity for the traces 344, a trace-to-reference-plane spacing 346, defines spacing from an edge trace 344 with a trace width 348, and the edge of the third voltage-reference plane 338 that is spaced apart and adjacent the first voltage-reference plane 310.

Figure 4:
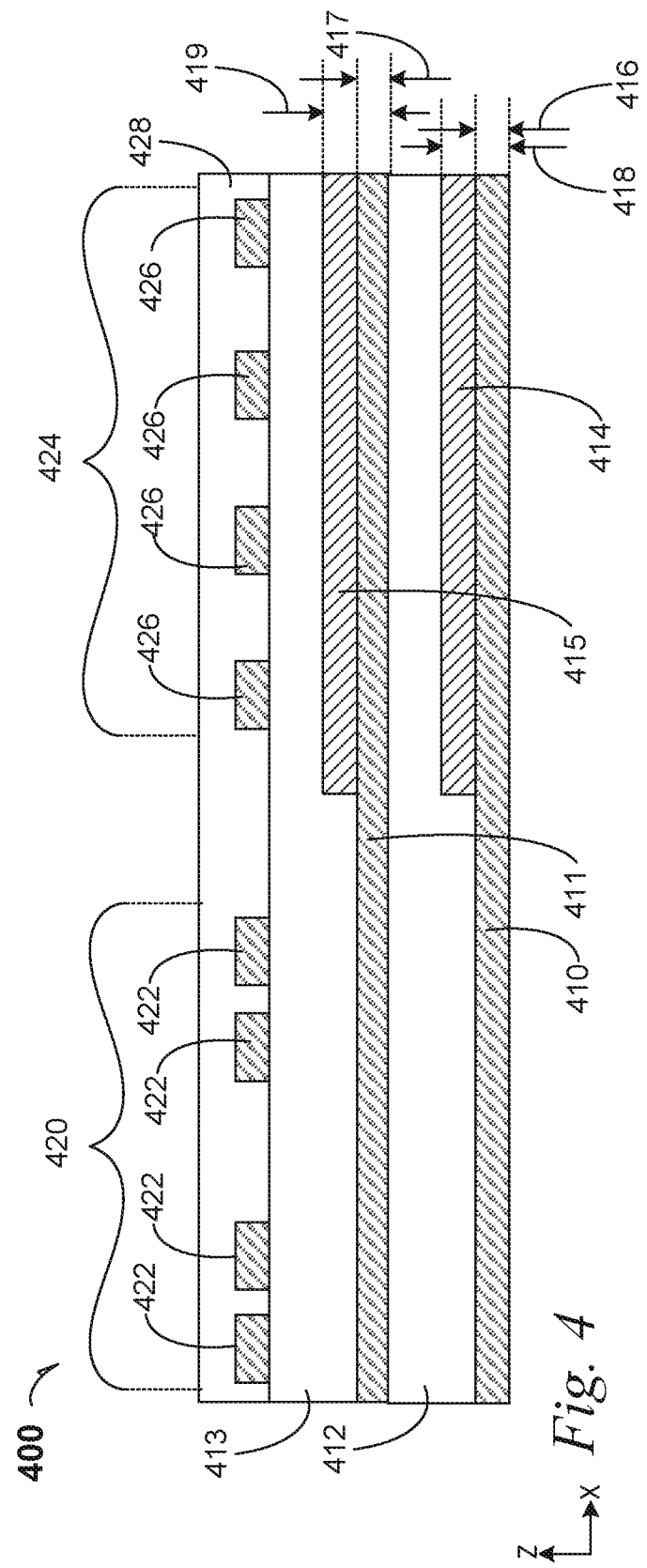
FIG. 4 is a cross-section elevation of an integrated-circuit package substrate according to an embodiment.

FIG. 4 is a cross-section elevation of an integrated-circuit package substrate 400 according to an embodiment.

In an embodiment, adjacent voltage-reference planes are aligned and vertically (Z-direction) stacked. Adjacent stacked voltage-reference planes may have opposite polarities such as a first voltage-reference plane is associated with ground (Vss), and an adjacent but vertically stacked voltage-reference plane is associated with power (Vcc). Where an increased cross section portion (e.g., X-Z portion) in a signal region (see item 424), reduced direct current (DC) resistance reduces the IR drop and associated power supply induced jitter or noise. Reduced distance between the Vss and Vcc reference planes (e.g., through reduced dielectric gap between the Vss and Vcc planes) improves power delivery noise through reduced inductance loop.

A first bottom voltage-reference plane 410 is embedded in a composite organic mass 412, and other materials may be found below the first bottom voltage-reference plane 410. A second bottom voltage-reference plane 414 contacts the first bottom voltage-reference plane 410, and it has a different X-Y footprint from the first bottom voltage-reference plane 410. The first and second bottom voltage-reference planes 410, 414 are an integral structure. The second bottom voltage-reference plane 414 includes at least a portion of the first bottom voltage-reference plane 410. The second bottom voltage-reference plane 414 includes a trench portion of the bottom composite organic mass 412. In an embodiment, the first bottom voltage-reference plane 410 has a first Z-height 416, and the second bottom voltage-reference plane 414 has a second Z-height 418 that includes at least a portion of the first. Z-height 416. In an embodiment, the second Z-height 418 is greater than the first Z-height 416.

A first top voltage-reference plane 411 is embedded in a top composite organic mass 413. A second top voltage-reference plane 415 contacts the first top voltage-reference plane 411, and it has a different X-Y footprint from the first top voltage-reference plane 411. The first and second top voltage-reference planes 411, 415 are an integral structure. The second top voltage-reference plane 415 includes at least a portion of the first top voltage-reference plane 411. The second top voltage-reference plane 415 includes a trench portion of the top composite organic mass 413. In an embodiment, the first top voltage-reference plane 411 has a first Z-height 417, and the second top voltage-reference plane 415 has a second Z-height 419 that includes at least a portion of the first Z-height 417. In an embodiment, the second Z-height 419 is greater than the first Z-height 417. As depicted, composite bottom voltage reference planes 410 and 414, and the composite top voltage-reference planes 411 and 415 are referred to as 3D voltage reference planes as each composite occupies at least a portion of the same Z-heights within the integrated-circuit package substrate 400.

In an embodiment, the composite top voltage-reference planes 411 and 415 are associated to a ground (Vss) reference voltage and the adjacent (e.g., vertically stacked) composite bottom voltage-reference planes 410 and 414 are associated to a power (Vcc) reference voltage.

In an embodiment, a first signal region 420 of the integrated-circuit package substrate 400 includes differential signal traces 422 that are superposed above a region of the integrated-circuit package substrate 400 at the first top voltage-reference plane 411 that is not also occupied by the second top voltage-reference plane 415. A second signal region 424, such as for single-ended signal traces 426 that are superposed above the second top voltage-reference plane 415, such that a composite-thickness 419 acts as a current return path for the single-ended signal traces 426. Consequently for the signal traces 426, reduced cross-talk is achieved through close proximity to the current return path (e.g., the second top voltage-reference plane 415), while reduced conductor losses of the differential signal traces 422 may be also achieved through increased distance from the current return path (e.g., the first top voltage-reference plane 411).

In an embodiment, an upper organic structure 428 is applied over the several traces 422 and 426 to complete a covering of the several traces.

Figure 5:
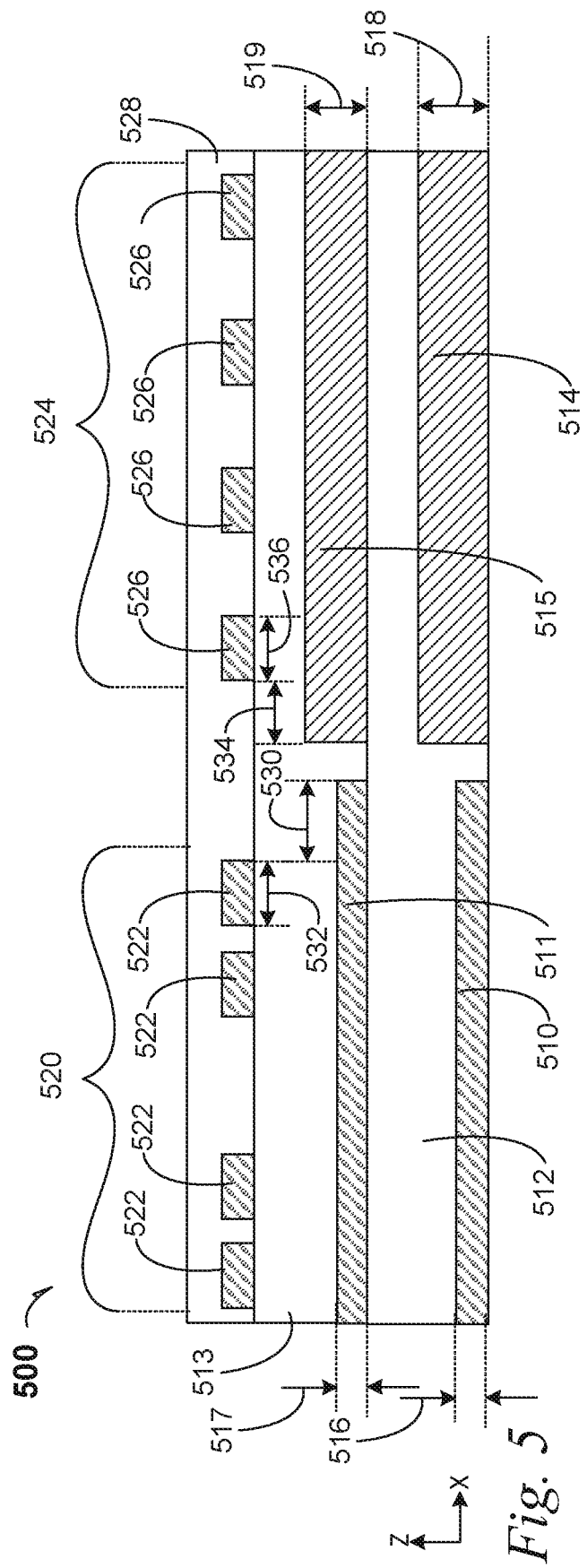
FIG. 5 is a cross-section elevation of an integrated-circuit package substrate according to an embodiment.

FIG. 5 is a cross-section elevation of an integrated-circuit package substrate 500 according to an embodiment. A stacked gradient voltage-reference plane 515 is horizontally isolated from an adjacent stacked gradient voltage reference plane 511. The raised thicknesses are characterized as within a trench portion in dielectric material that makes up organic structures of the integrated-circuit package substrate 500.

A first bottom voltage-reference plane 510 is embedded in a composite organic mass 512, and other materials may be found below the first bottom voltage-reference plane 510. A second bottom voltage-reference plane 514 is seated adjacent but spaced apart from the first bottom voltage-reference plane 510, and it has a completely different X-Y footprint from the first bottom voltage-reference plane 510. In an embodiment, the first bottom voltage-reference plane 510 has a first Z-height 516, and the second bottom voltage-reference plane 514 has a second Z-height 518. In an embodiment, the second Z-height 518 is greater than the first Z-height 516.

A first top voltage-reference plane 511 is embedded in a composite organic mass 513, and other materials may be found below the first bottom voltage-reference plane 510. In an embodiment, the first bottom voltage-reference plane 510 is a power (Vcc) reference plane associated to a power supply that can be operated at 1.0V, while the first top voltage-reference plane 511 is a ground (Vss) reference plane associated to a ground voltage source.

A second top voltage-reference plane 515 is seated adjacent but spaced apart from the first top voltage-reference plane 511, and it has a completely different X-Y footprint from the first top voltage-reference plane 511. In an embodiment, the first top voltage-reference plane 511 has a first Z-height 517, and the second top voltage-reference plane 515 has a second Z-height 519. In an embodiment, the second Z-height 519 is greater than the first. Z-height 517. As depicted, composite bottom voltage reference planes 510 and 514, and the composite top voltage-reference planes 511 and 515 are referred to as 3D voltage reference planes as each composite occupies at least a portion of the same Z-heights within the integrated-circuit package substrate 500.

In an embodiment, the second bottom voltage-reference plane 514 is a power (Vcc) reference plane associated to a power supply that can be operated at a different voltage compared to the first bottom voltage-reference plane 510, such as at 1.5V, while the second top voltage-reference plane 515 is a ground (Vss) reference plane associated to a ground voltage source.

In an embodiment, a first signal region 520 of the integrated-circuit package substrate 500 includes differential signal traces 522 that are superposed above a region of the integrated-circuit package substrate 500 at the first top voltage-reference plane 511. A second signal region 524, such as for single-ended signal traces 526 that are superposed above the second top voltage-reference plane 515, such that the thickness 519 acts as a current return path for the single-ended signal traces 526. Consequently for the signal traces 526, reduced cross-talk is achieved through close proximity to the current return path (e.g., the second top voltage-reference plane 515), while reduced conductor losses of the differential signal traces 522 may be also achieved through increased distance from the current return path (e.g., the first top voltage-reference plane 511).

In an embodiment, an upper organic structure 528 is applied over the several traces 522 and 526 to complete a covering of the several traces.

To preserve signal integrity for the traces 522, a trace-to-reference-plane spacing 530, defines spacing from an edge trace 522 with a trace width 532, and the edge of the first top voltage-reference plane 511 that is spaced apart and adjacent the second top voltage-reference plane 515. Similarly to preserve signal integrity for the traces 526, a trace-to-reference-plane spacing 534, defines spacing from an edge trace 526 with a trace width 536, and the edge of the second top voltage-reference plane 515 that is spaced apart and adjacent the first top voltage-reference plane 511.

Figure 6:
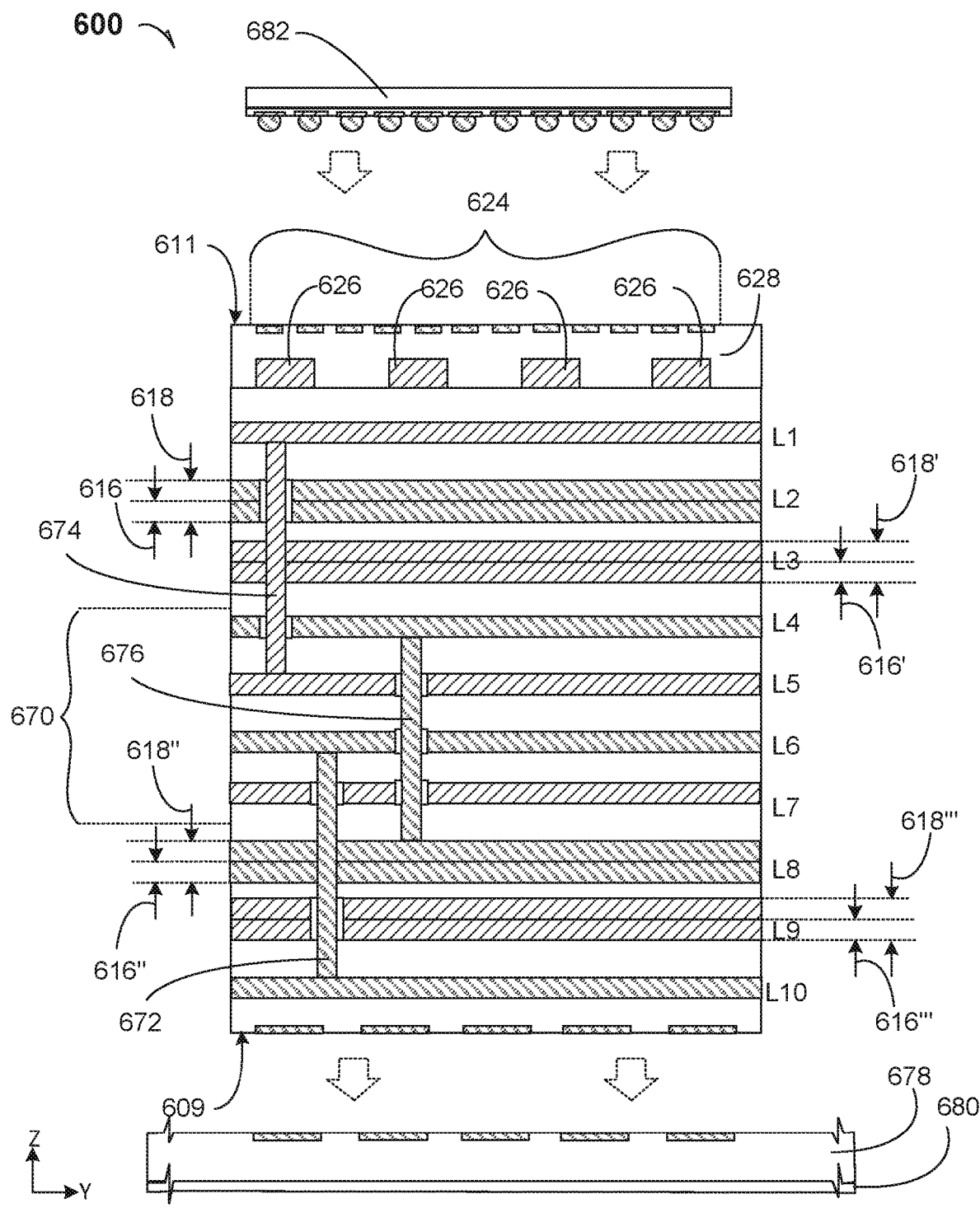
FIG. 6 is a cross-section elevation of an integrated-circuit package substrate according to several embodiments.

FIG. 6 is a cross-section elevation of an integrated-circuit package substrate 600 according to several embodiments. A printed wiring board stack-up includes a die side 611 and a land side 609. The printed wiring board stack-up includes trench-located, enhanced voltage-reference planes outside a functional core area 670. As depicted, 10 levels, L1 through L10, provide an exemplar total number of layers, including enhanced voltage-reference planes such as at L2, L3, L8 and L9.

In an embodiment, stacked voltage-reference planes are aligned vertically (Z-direction). Adjacent stacked voltage-reference planes may have opposite polarities such as a first voltage-reference plane is associated with ground reference voltage (Vss), and an adjacent but vertically stacked voltage-reference plane is associated with power reference voltage (Vcc). A first bottom voltage-reference plane L10 is embedded in a composite organic mass, and other materials may be found below the first bottom voltage-reference plane L10. A second bottom voltage-reference plane L9 is insulated from the first bottom voltage-reference plane L10 by a dielectric layer. A third bottom voltage-reference plane L8 is coupled to the first bottom voltage-reference plane L10 with at least a portion of a first vertical via 672 (e.g., a buried via or a blind via) A fourth bottom voltage-reference plane L7 is part of the functional core area 670 and is insulated from the first vertical via 672 by a dielectric material.

In an embodiment, a first top voltage-reference plane L1 is embedded in a top composite organic mass. A second top voltage-reference plane L2 is insulated from the first top voltage-reference plane L1 by a dielectric layer. A third top voltage-reference plane L3 is coupled to the first top voltage-reference plane L1 by a second vertical via 674. And a fourth top voltage-reference plane L4 is part of the functional core area 670 and is insulated from the second vertical via 674 by a dielectric material. Voltage reference planes L5 and L6 are also part of the functional core area 670.

In an embodiment, power reference voltage (Vcc) is supplied to the first, third and fifth top voltage-reverence planes L1, L3 and L5, respectively at a first potential such as 1.0V, and power reference voltage (Vcc) is supplied to the second and fourth bottom voltage-reference planes L9 and L7, respectively as a second potential such as 1.5 V.

In an embodiment, a ground reference voltage (Vss) is coupled to the second and fourth top voltage-reference planes L2 and L4, and to the first and third bottom voltage-reference planes L10 and L8 as well as the core area voltage-reference plane L6. In an embodiment, the core area Vss reference plane L4 is coupled to the third bottom voltage-reference planes L8 through a third vertical vias 676 (e.g., a buried via).

In an embodiment, the several voltage-reference planes have a first thickness 616 and second 618, with appropriate notations nominal, i, ii and iii. The thickened voltage-reference planes L2, L3, L8 and L9, assist in lowering resistivity for useful voltage-supply (Vcc) and ground-reference (Vss) employments.

In an embodiment, an upper organic structure 628 is applied over several traces 626, such as in a signal region 624, to complete a covering of the several traces. In an embodiment, other traces run orthogonal to the plane of the drawing.

In an embodiment, the stack up is being seated at the land side 609 upon a board such as a motherboard 678. In an embodiment, the board 678 has an external shell 680 that is at least one of a structural and electrically insulative shell 680. For example, the board 678 and external shell 680 are an integral assembly and the entire assembly 600 is part of a hand-held device such as a mobile computing platform. In an embodiment, the entire assembly 600 including the external shell 680 are part of a drone computing platform.

In an embodiment, an integrated-circuit die 682 is being assembled to the stack up at the die side 611. In an embodiment, the integrated-circuit die 682 includes a silicon interposer. In an embodiment, the integrated-circuit die 682 includes a package substrate. It may now be understood that each of the several described and illustrated embodiments in this disclosure, that signal transmission line and power delivery network structures of gradient voltage planes, may employ at least one of a board 678 embodiment, as well as an external shell 780 embodiment when useful. It may now be understood that each of the several described and illustrated embodiments in this disclosure, that signal transmission line and power delivery network structures of gradient voltage planes, may employ at least one of an integrated-circuit die 682 embodiment.

Table 1 is a normalized sensitivity representation for direct-current (DC) resistance as related to several power supply (Vcc) configurations that employ several thickened voltage planes according to several embodiments.

TABLE 1

| Vcc Layer Normalized DC Resistance | |
| --- | --- |
| Thickness | Normalized Resistance |
| Baseline | 1.0 |
| 1.5X | 0.68 |

TABLE 1-continued

| Vcc Layer Normalized DC Resistance | |
| --- | --- |
| Thickness | Normalized Resistance |
| 2.0X | 0.5 |
| 2.5X | 0.4 |
| 3.0X | 0.37 |

In an embodiment, an approximate triple-resistance reduction is achieved on an electronics-grade copper Vcc-reference plane under a 1.0 V potential, where a thickness increases from 28.10 μm to 92.56 μm.

Figure 7:
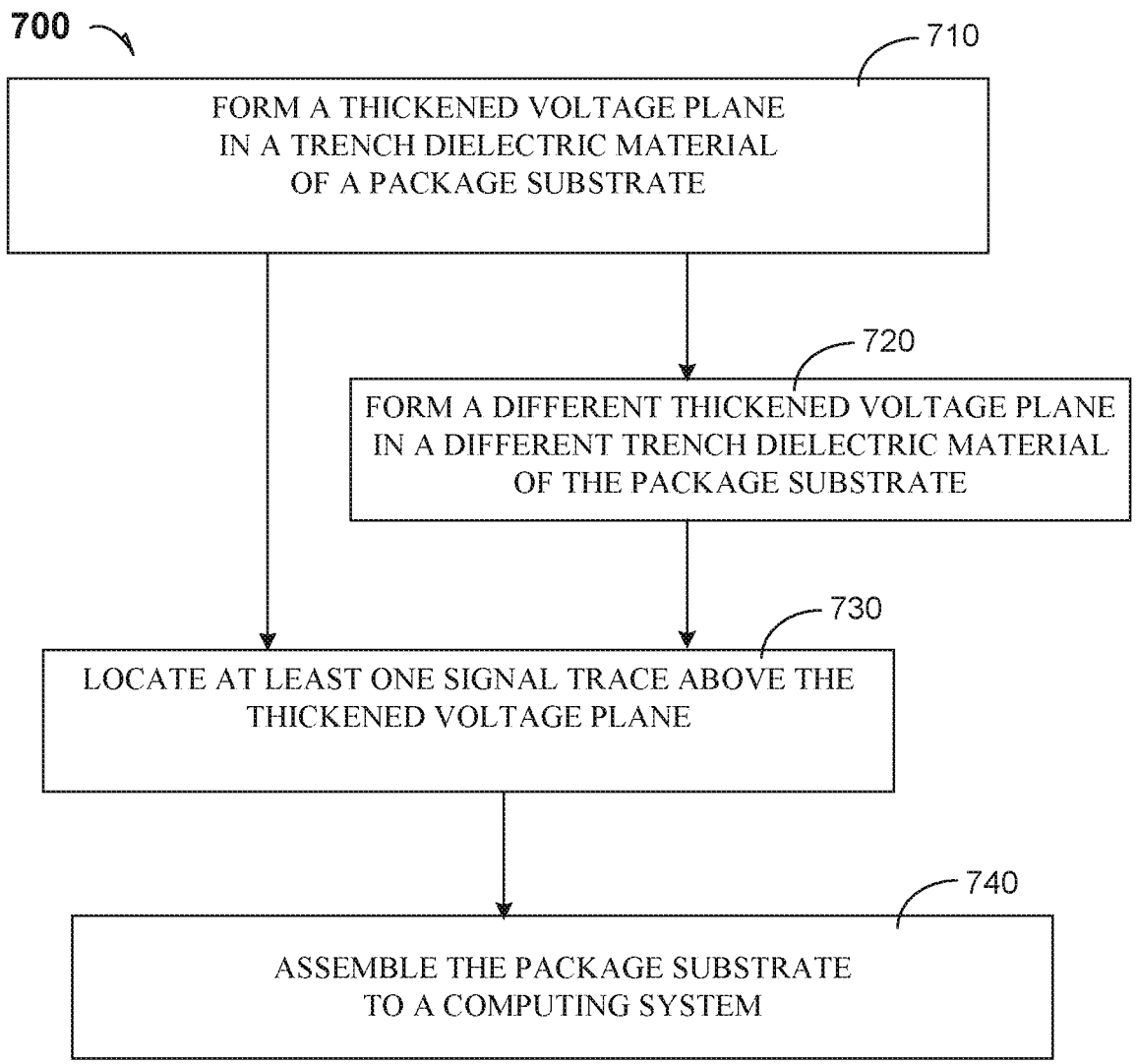
FIG. 7 is a process flow diagram according to several embodiments.

FIG. 7 is a process flow diagram according to several embodiments.

At 710, a trench is opened in a dielectric material and a thickened voltage plane is achieved, whether by adding to a previous voltage plane, or forming an isolated voltage plane. For example, a trench is formed in what becomes the composite organic mass 112 (e.g., onto the first voltage-reference plane 110), and the second voltage-reference plane 114 is formed as depicted in FIG. 1. In another example, a trench is opened in a dielectric material and a thickened voltage plane is achieved by forming the second voltage plane 214 as depicted in FIG. 2.

At 720, the process includes forming another thickened voltage plane that is different from the first voltage plane, in a trench in a dielectric material. In an embodiment, the voltage plane 410 and 414 is different in use than the voltage plane 411 and 415, such as one is Vcc and the other is Vss.

At 730, the process includes locating differential-signal traces above a signal region where a thinner voltage-reference plane, e.g., 110 is compared to a thicker voltage plane, e.g. 114, where single-ended signal traces, e.g. 126 are located.

At 740, the process includes assembling the integrated-circuit package substrate to a computing system.

Figure 8:
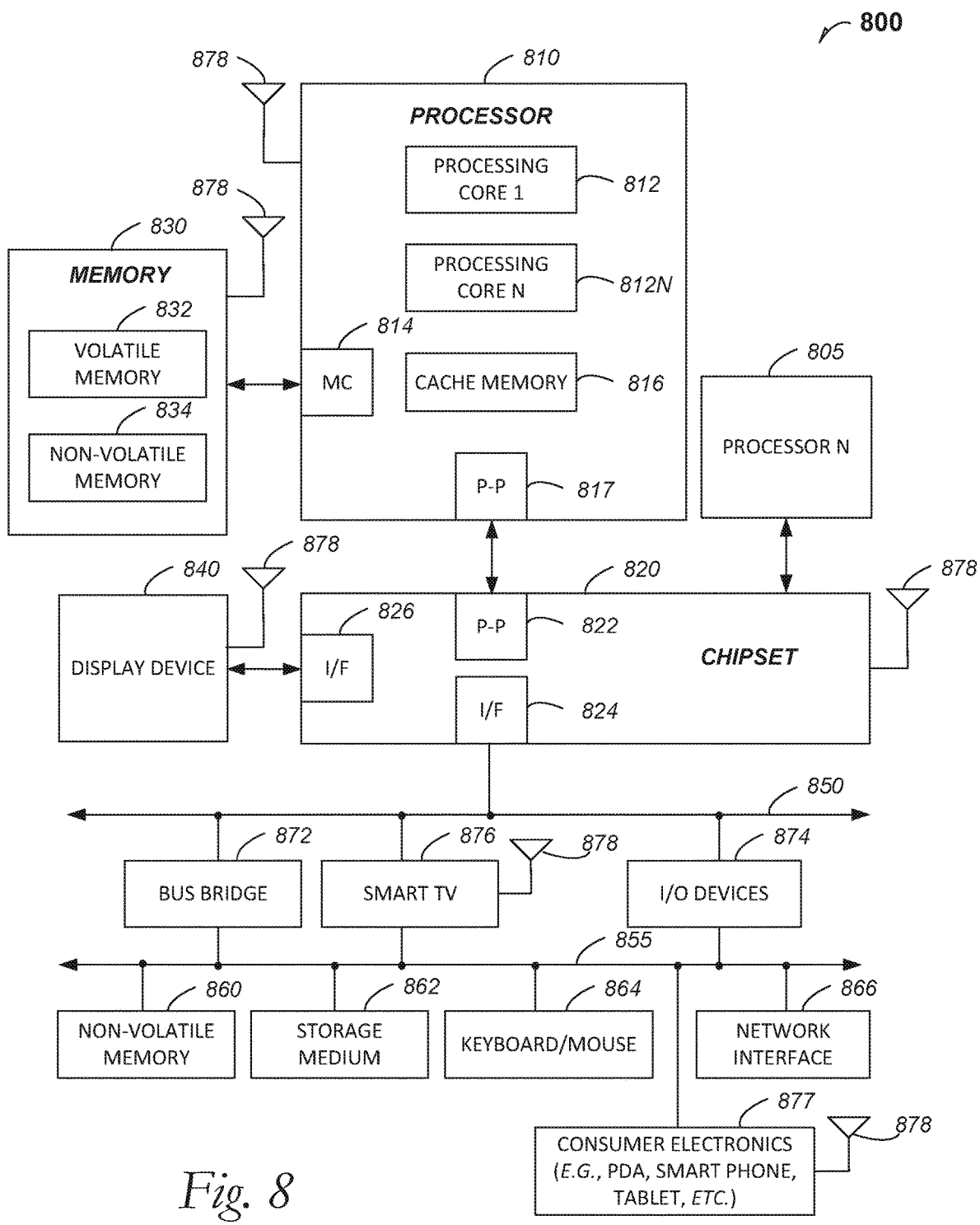
FIG. 8 is included to show an example of a higher-level device application for the disclosed embodiments.

FIG. 8 is included to show an example of a higher-level device application for the disclosed embodiments. The composite 3D voltage-reference plane embodiments may be found in several parts of a computing system. In an embodiment, the composite 3D voltage-reference plane semiconductor apparatus is part of a communications apparatus such as is affixed to a cellular communications tower. In an embodiment, a computing system 800 includes, but is not limited to, a desktop computer. In an embodiment, a system 800 includes, but is not limited to a laptop computer. In an embodiment, a system 800 includes, but is not limited to a netbook. In an embodiment, a system 800 includes, but is not limited to a tablet. In an embodiment, a system 800 includes, but is not limited to a notebook computer. In an embodiment, a system 800 includes, but is not limited to a personal digital assistant (PDA). In an embodiment, a system 800 includes, but is not limited to a server. In an embodiment, a system 800 includes, but is not limited to a workstation. In an embodiment, a system 800 includes, but is not limited to a cellular telephone. In an embodiment, a system 800 includes, but is not limited to a mobile computing device. In an embodiment, a system 800 includes, but is not limited to a smart phone. In an embodiment, a system 800 includes, but is not limited to an internet appliance. Other types of computing devices may be configured with the microelectronic device that includes composite 3D voltage-reference plane embodiments.

In an embodiment, the processor 810 has one or more processing cores 812 and 812N, where 812N represents the Nth processor core inside processor 810 where N is a positive integer. In an embodiment, the electronic device system 800 using a composite 3D voltage-reference plane embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the MAA apparatus in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834. In an embodiment, the processor 810 is coupled with memory 830 and chipset 820. The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a composite 3D voltage-reference plane embodiment as set forth in this disclosure. The chipset 820 enables the processor 810 to connect to other elements in the composite 3D voltage-reference plane embodiments in a system 800. In an embodiment, interfaces 817 and 822 operate in accordance with a PtP communication protocol such as the Intel® QuickPath Interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a composite 3D voltage-reference plane in a system. Additionally, the chipset 820 connects to one or more buses 850 and 855 that interconnect various elements 874, 860, 862, 864, and 866. Buses 850 and 855 may be interconnected together via a bus bridge 872 such as at least one composite 3D voltage-reference plane embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the composite 3D voltage-reference plane embodiment in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 81:2.

Where useful, the computing system 800 may have a broadcasting structure interface such as for affixing the composite 3D voltage-reference plane to a cellular tower.

To illustrate the composite 3D voltage-reference plane embodiments and methods disclosed herein, a non-limiting list of examples is provided herein:

Example 1 is a semiconductor package substrate, comprising: a package substrate including a die side and a land side; a first voltage reference plane in the package substrate, wherein the first voltage-reference plane has a first thickness; a second voltage-reference plane in the package substrate, wherein the second voltage-reference plane has a second thickness, wherein the first and second voltage-reference planes occupy at least some of the same Z-height in the package substrate; and at least one trace above the voltage-reference planes.

In Example 2, the subject matter of Example 1 optionally includes an integrated-circuit die on the die side, and wherein the second voltage-reference plane includes a trench.

In Example 3, the subject matter of any one or more of Examples 1-2 optionally include wherein the at least one signal trace includes at least one pair of differential signal traces.

In Example 4, the subject matter of any one or more of Examples 1-3 optionally include wherein the at least one signal trace includes at least two pair of differential signal traces located above the first voltage-reference plane, wherein the first thickness is less than the second thickness.

In Example 5, the subject matter of any one or more of Examples 1-4 optionally include wherein the at least one signal trace is located above the first voltage-reference plane, wherein the first thickness is less than the second thickness; and at least on single-ended signal trace above the second voltage-reference plane.

In Example 6, the subject matter of any one or more of Examples 1-5 optionally include wherein the first and second voltage reference planes are stacked and contacted, wherein the at least one signal trace includes at least one pair of differential signal traces and at least one single-ended signal trace; wherein the at least one pair of differential-signal traces is only above the first voltage-reference plane, and wherein the at least one single-ended signal trace is above both voltage-reference planes.

In Example 7, the subject matter of any one or more of Examples 1-6 optionally include wherein the second thickness includes at least a portion of the first thickness.

In Example 8, the subject matter of any one or more of Examples 1-7 optionally include wherein the first and second voltage-reference planes are isolated within the semiconductor package substrate.

In Example 9, the subject matter of Example 8 optionally includes wherein the at least one signal trace includes at least one pair of differential signal traces.

In Example 10, the subject matter of any one or more of Examples 8-9 optionally include wherein the at least one signal trace includes at least two pair of differential signal traces located above the first voltage-reference plane, wherein the first thickness is less than the second thickness.

In Example 11, the subject matter of any one or more of Examples 8-10 optionally include wherein the at least one signal trace is located above the first voltage-reference plane, wherein the first thickness is less than the second thickness; and at least on single-ended signal trace above the second voltage-reference plane.

In Example 12, the subject matter of any one or more of Examples 1-11 optionally include a third voltage-reference plane, wherein each of the first, second and third voltage reference planes are isolated within the semiconductor package substrate, wherein the third voltage-reference plane also occupies some of the same Z-height in the package substrate, and wherein the third voltage-reference plane has a third thickness that is different from the first and second thicknesses.

In Example 13, the subject matter of Example 12 optionally includes wherein the at least one signal trace includes at least one pair of differential signal traces.

In Example 14, the subject matter of any one or more of Examples 12-13 optionally include wherein the at least one signal trace includes at least two pair of differential signal traces located above the first voltage-reference plane, wherein the first thickness is less than the second thickness, and wherein the third thickness is less than the second thickness and more than the first thickness.

In Example 15, the subject matter of any one or more of Examples 12-14 optionally include wherein the at least one signal trace is located above the first voltage-reference plane, wherein the first thickness is more than the second thickness, and wherein the third thickness is more than the second thickness and less than the first thickness; and at least one single-ended signal trace above the first voltage-reference plane.

In Example 16, the subject matter of any one or more of Examples 12-15 optionally include wherein the at least one signal trace is located above the first voltage-reference plane, wherein the first thickness is more than the second thickness, and wherein the third thickness is more than the second thickness and less than the first thickness; at least one single-ended signal trace above the first voltage-reference plane; at least one differential-signal pair above the second voltage-reference plane; and at least one differential-signal pair above the third voltage-reference plane.

In Example 17, the subject matter of any one or more of Examples 1-16 optionally include wherein the first and second voltage-reference planes are first and second bottom reference planes, further including: a first top voltage reference plane in the package substrate, wherein the first top voltage-reference plane has a first thickness; a second top voltage-reference plane in the package substrate, wherein the second top voltage-reference plane has a second thickness, wherein the first and second top voltage-reference planes occupy at least some of the same Z-height in the package substrate; and wherein the first and second top voltage-reference planes are stacked above the first and second bottom reference planes, and wherein the least one trace is above the first and second top voltage-reference planes.

In Example 18, the subject matter of any more of one of Examples 1-17, optionally include wherein the top voltage-reference planes are coupled to ground (Vss) reference voltage, and wherein the bottom voltage-reference planes are coupled to power (Vcc) reference voltage.

In Example 19, the subject matter of any one or more of Examples 1-18 optionally includes wherein the at least one signal trace includes at least one pair of differential signal traces above the top and bottom first voltage-reference planes; and wherein the at least one signal trace includes at least one single-ended signal trace above the top and bottom second voltage-reference planes.

Example 20 is an integrated-circuit package substrate, comprising: a package substrate including a die side and a land side; a first bottom voltage reference plane in the package substrate, wherein the first bottom voltage-reference plane has a first thickness; a second bottom voltage-reference plane in the package substrate and isolated from the first bottom voltage-reference plane, wherein the second bottom voltage-reference plane has a second thickness, wherein the first and second bottom voltage-reference planes occupy at least some of the same Z-height in the package substrate; at least one trace above the voltage-reference planes; a first top voltage-reference plane stacked above the first bottom voltage reference plane; a second top voltage-reference plane stacked above the second bottom voltage-reference plane and isolated from the first top voltage-reference plane within the semiconductor package substrate; and at least one signal trace above one of the first and second top voltage reference planes.

In Example 21, the subject matter of Example 20 optionally includes an integrated-circuit die on the die side.

In Example 22, the subject matter of any one or more of Examples 20-21 optionally include wherein the at least one signal trace includes at least one pair of differential signal traces.

In Example 23, the subject matter of Example 22 optionally includes wherein the at least one signal trace includes at least two pair of differential signal traces located above the first top voltage-reference plane, wherein the first thickness is less than the second thickness.

In Example 24, the subject matter of any one or more of Examples 22-23 optionally include wherein the at least one signal trace is located above the first top voltage-reference plane, wherein the first thickness is less than the second thickness; and at least one single-ended signal trace above the top second voltage-reference plane.

Example 25 is an integrated-circuit package substrate, comprising: a package substrate including a die side and a land side; a functional core section including four voltage planes spaced apart by dielectric layers; a first top voltage plane below the die side; a second top voltage plane spaced apart from the first top voltage plane by a dielectric layer, wherein the second top voltage plane has a greater thickness than the first top voltage plane; a third top voltage plane spaced apart from the second top voltage plane by a dielectric layer, wherein the third top voltage plane is spaced apart and adjacent by a voltage plane in the functional core section; a first bottom voltage plane above the land side; a second bottom voltage plane spaced apart from the first bottom voltage plane by a dielectric layer, wherein the second bottom voltage plane has a greater thickness than the first bottom voltage plane; a third bottom voltage plane spaced apart from the second bottom voltage plane by a dielectric layer, wherein the third bottom voltage plane is spaced apart and adjacent a voltage plane in the functional core section.

In Example 26, the subject matter of Example 25 optionally includes an integrated-circuit die on the die side.

In Example 27, the subject matter of Example 26 optionally includes wherein the integrated-circuit die is part of a computing system, further including: a board coupled to the land side; an external shell contacting the board; and wherein the integrated-circuit package substrate supports a chipset.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package substrate, comprising:
a package substrate including a die side and a land side;
a first voltage reference plane in the package substrate, wherein the first voltage-reference plane has a first thickness;
a second voltage-reference plane in the package substrate, wherein the second voltage-reference plane has a second thickness different from the first thickness, wherein the first and second voltage-reference planes occupy at least some of the same Z-height in the package substrate; and
at least one trace above the voltage-reference planes, wherein the at least one signal trace includes at least a pair of differential signal traces located above the first voltage-reference plane, wherein the first thickness is less than the second thickness.

2. The integrated-circuit package substrate of claim 1, further including an integrated-circuit die on the die side, and wherein the second voltage-reference plane includes a trench.

3. The integrated-circuit package substrate of claim 1, wherein the at least one signal trace includes at least one pair of differential signal traces.

4. The integrated-circuit package substrate of claim 1, wherein the at least one signal trace is located above the first voltage-reference plane, wherein the first thickness is less than the second thickness; and
at least one single-ended signal trace above the second voltage-reference plane.

5. The integrated-circuit package substrate of claim 1, wherein the first and second voltage reference planes are stacked and contacted, wherein the at least one signal trace includes at least one pair of differential signal traces and at least one single-ended signal trace;

wherein the at least one pair of differential-signal traces is only above the first voltage-reference plane, and wherein the at least one single-ended signal trace is above both voltage-reference planes.

6. The integrated-circuit package substrate of claim 1, wherein the first and second voltage reference planes are stacked and contacted, wherein the second thickness includes at least a portion of the first thickness.

7. The integrated-circuit package substrate of claim 1, wherein the first and second voltage-reference planes are isolated within the semiconductor package substrate.

8. The integrated-circuit package substrate of claim 7, wherein the at least one signal trace includes at least two pair of differential signal traces located above the first voltage-reference plane, wherein the first thickness is less than the second thickness.

9. The integrated-circuit package substrate of claim 7, wherein the at least one signal trace is located above the first voltage-reference plane, wherein the first thickness is less than the second thickness; and at least on single-ended signal trace above the second voltage-reference plane.

10. The integrated-circuit package substrate of claim 1, further including a third voltage-reference plane, wherein each of the first, second and third voltage reference planes are isolated within the semiconductor package substrate, wherein the third voltage-reference plane also occupies some of the same Z-height in the package substrate, and wherein the third voltage-reference plane has a third thickness that is different from the first and second thicknesses.

11. The integrated-circuit package substrate of claim 10, wherein the at least one signal trace includes at least one pair of differential signal traces.

12. The integrated-circuit package substrate of claim 10, wherein the at least one signal trace includes at least two pair of differential signal traces located above the first voltage-reference plane, wherein the first thickness is less than the second thickness, and wherein the third thickness is less than the second thickness and more than the first thickness.

13. The integrated-circuit package substrate of claim 10, wherein the at least one signal trace is located above the first voltage-reference plane, wherein the first thickness is more than the second thickness, and wherein the third thickness is more than the second thickness and less than the first thickness; and at least one single-ended signal trace above the first voltage-reference plane.

14. The integrated-circuit package substrate of claim 10, wherein the at least one signal trace is located above the first voltage-reference plane, wherein the first thickness is more than the second thickness, and wherein the third thickness is more than the second thickness and less than the first thickness;

at least one single-ended signal trace above the first voltage-reference plane;

at least one differential-signal pair above the second voltage-reference plane; and at least one differential-signal pair above the third voltage-reference plane.

15. The integrated-circuit package substrate of claim 1, wherein the first and second voltage-reference planes are first and second bottom reference planes, further including:

a first top voltage reference plane in the package substrate, wherein the first top voltage-reference plane has a first thickness;

a second top voltage-reference plane in the package substrate, wherein the second top voltage-reference plane has a second thickness, wherein the first and second top voltage-reference planes occupy at least some of the same Z-height in the package substrate; and wherein the first and second top voltage-reference planes are stacked above the first and second bottom reference planes, and wherein the least one trace is above the first and second top voltage-reference planes.

16. The integrated-circuit package substrate of claim 15, wherein the at least one signal trace includes at least one pair of differential signal traces above the top and bottom first voltage-reference planes; and wherein the at least one signal trace includes at least one single-ended signal trace above the top and bottom second voltage-reference planes.

17. The integrated-circuit package substrate of claim 15, wherein the top voltage-reference planes are coupled to ground (Vss) reference voltage, and wherein the bottom voltage-reference planes are coupled to power (Vcc) reference voltage.

* * * * *